(12) United States Patent
Markalous et al.

(10) Patent No.: US 9,989,581 B2
(45) Date of Patent: Jun. 5, 2018

(54) METHOD AND DEVICE FOR LOCATING PARTIAL DISCHARGES IN ELECTRIC CABLES

(71) Applicant: Hagenuk KMT Kabelmesstechnik GmbH, Radeburg (DE)

(72) Inventors: Sacha Markalous, Radebeul (DE); Marco Küttner, Dresden (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 170 days.

(21) Appl. No.: 15/035,760

(22) PCT Filed: Nov. 17, 2014

(86) PCT No.: PCT/EP2014/074755
§ 371 (c)(1),
(2) Date: May 11, 2016

(87) PCT Pub. No.: WO2015/078716
PCT Pub. Date: Jun. 4, 2015

(65) Prior Publication Data
US 2016/0282402 A1   Sep. 29, 2016

(30) Foreign Application Priority Data
Nov. 29, 2013 (DE) .................. 10 2013 224 573

(51) Int. Cl.
*G01R 31/11* (2006.01)
*G01R 31/12* (2006.01)
*G01R 31/08* (2006.01)

(52) U.S. Cl.
CPC ............ *G01R 31/088* (2013.01); *G01R 31/11* (2013.01); *G01R 31/1272* (2013.01); *G01R 31/083* (2013.01)

(58) Field of Classification Search
CPC .. G01R 31/11; G01R 31/1272; G01R 31/083; G01R 31/088
See application file for complete search history.

(56) References Cited

U.S. PATENT DOCUMENTS

| | | | |
|---|---|---|---|
| 5,416,418 A * | 5/1995 | Maureira | G01R 31/083 324/532 |
| 2009/0119035 A1 | 5/2009 | Younsi | |
| 2009/0177420 A1 | 7/2009 | Fournier et al. | |
| 2010/0253364 A1 | 10/2010 | Ganesh | |
| 2013/0211750 A1 | 8/2013 | Gamacho Vecino Fernando et al. | |

\* cited by examiner

*Primary Examiner* — Bryan Bui
(74) *Attorney, Agent, or Firm* — Michael Soderman

(57) ABSTRACT

Methods and devices for locating partial discharges in electric cables with a high-voltage source coupled to the cable to be tested, a decoupling unit connected to an end of the cable and a data-processing system that is connected via a sensor unit to the decoupling unit and that detects a partial discharge or partial discharges when they exist from the sensor signals. The methods and devices particularly distinguish themselves by a short evaluation duration for the locating process. This is done by detecting events, parameterizing the events identified as pulses, formation of pairs of the events identified as pulses and parameterized, classification of the event pairs, assignment of a partial discharge from the classification and determination of the location of the partial discharge(s) from the different in transit times between the respective partial discharge and its accompanying reflection.

13 Claims, 2 Drawing Sheets

METHOD AND DEVICE FOR LOCATING PARTIAL DISCHARGES IN ELECTRIC CABLES

CROSS REFERENCE TO RELATED APPLICATIONS

This application is the U.S. national stage of International Application No. PCT/EP2014/074755, filed on Nov. 17, 2014, and claims the priority thereof. The international application claims the priority of German Application No. DE 10 2013 224 573.4 filed on Nov. 29, 2013; all applications are incorporated by reference herein in their entirety.

BACKGROUND

The invention relates to methods and devices for locating partial discharges in electric cables with a high-voltage source coupled to the cable to be tested, a decoupling unit connected to an end of the cable and a data-processing system that is connected via a sensor unit to the decoupling unit and that detects a partial discharge or partial discharges when they exist from the sensor signals.

An early detection of weak points in high-voltage electric cables is important for electric utility companies to keep the down times of the cables is short as possible. A possible early indicator for the breakdown of a high-voltage cable is the occurrence of partial discharges. Not only the detection of partial discharges but also information about where they arise is important to narrow down the location of the fault in the cable.

A method and a circuit arrangement for testing the insulation of specimens with a large inherent capacitance and for locating faults in power cables are known from the document DE 37 37 373 A1. A high-voltage transformer is used here; a charging capacitor and a semiconductor controlled with a different frequency are provided on its primary side. A synchronous demodulator is connected to the secondary side. The power cable to be measured is part of an electric circuit for the measurement. This involves an analog process with a manual evaluation of the measurement results.

The basic problem when locating partial discharges is above all the fact that large bandwidths exist for a high resolution of the location and large amounts of data accrue for the mostly digital processing. The large amounts of data arise, above all, because partial discharges occur randomly. An advance estimate is difficult as to whether no partial discharges, a few partial discharges or an extremely high number of partial discharges will arise in a certain time interval. Locating methods have to appropriately deal with this challenge to make a meaningful result of the locating process of partial discharges possible for the end customer.

Trigger-based methods in which information relevant for the locating process is included or can be included are used, as an example, to limit the amounts of data. The remaining amount of data is then usually fed into a display, where an experience measurement technician customarily carries out the locating processing himself. A drawback here is that the evaluation is only made a great deal later than the measurement. The reason for that involves the enormous amount of time that is required for a meaningful locating process compared to the duration of the data acquisition. Faulty measurements that may be made can therefore only be corrected in a time-consuming way, because the measurement, including the setup and dismantling of the measurement equipment, is already time-consuming. Moreover, the evaluation of the measurement data usually takes place with a delay.

A method and a device for locating the source of partial discharges is known from the document DE 600 20 050 T2 in which certain characteristics of the partial-discharge pulses are compared to a model experimentally created in advance. The model describes the change in the characteristic parameters in dependence upon the section, essentially at frequencies at which partial-discharge pulses occur. It should therefore be possible to determine the distance of a source of partial discharges to the measurement point with a specific level of accuracy.

A further difficulty in the locating process is the reliable detection of a partial discharge and an accompanying reflection at the free end of the cable or at the end of the cable supplied with a reflector. The path of the partial discharge that was traveled in the cable and therefore the location at which it occurred can be determined via the known or specified cable length and the cable speed from the difference in transit times between the partial discharge and its accompanying reflection, brought about by the end of the cable, which is usually open. The problem here is that the cable losses strongly attenuate the partial discharge and, even more, the accompanying reflection, especially in the case of long cables. Interference, even with only small noise amplitudes, can therefore make the locating process more difficult or even make it impossible.

SUMMARY

The invention relates to methods and devices for locating partial discharges in electric cables with a high-voltage source coupled to the cable to be tested, a decoupling unit connected to an end of the cable and a data-processing system that is connected via a sensor unit to the decoupling unit and that detects a partial discharge or partial discharges when they exist from the sensor signals. The methods and devices particularly distinguish themselves by a short evaluation duration for the locating process.

This is done by detecting events, parameterizing the events identified as pulses, formation of pairs of the events identified as pulses and parameterized, classification of the event pairs, assignment of a partial discharge from the classification and determination of the location of the partial discharge(s) from the different in transit times between the respective partial discharge and its accompanying reflection.

DETAILED DESCRIPTION

The problem of a quick detection of partial discharges in cables, and therefore detection directly at the measurement location at the end of the cable, is the basis for the invention specified in claims 1 to 13.

This problem is solved with the features specified in claims 1 and 13.

The methods and devices for locating partial discharges in electrical cables distinguish themselves, in particular, by a short evaluation duration of the locating process.

The methods for locating partial discharges in electric cables take place via a high-voltage source coupled to the cable to be tested, a decoupling unit connected to an end of the cable and a data-processing system that is connected via a sensor unit to the decoupling unit and that detects a partial discharge or partial discharges when they exist from the sensor signals.

This is done via the following steps:

Detection of events when they are present with a trigger with a threshold value from the sensor signals dependent upon the noise level, Parameterization of the events identified as pulses, wherein the parameters are the point in time of the start of the pulse, the point in time of the end of the pulse, the amplitude of the pulse, the point in time of the amplitude of the pulse, the pulse width, the lower cutoff frequency of the pulse and the upper cutoff frequency of the pulse.

Pair formation of the events that are identified as pulses and parameterized,

Classification of the event pairs, wherein the pulses representing the event pairs are classified according to the differential time, the amplitude, the polarity, the amplitude attenuation, the pulse width, the pulse-width dispersion, the cutoff frequency or a combination of them and the cable attenuation as a characteristic in each case, Assignment of a partial discharge from the classification and Determination of the location of the partial discharge(s) from the difference in transit times between the respective partial discharge and its accompanying reflection.

The data processing system is consequently a data-processing system that identifies existing events as an impulse with a trigger with a threshold value from sensor signals dependent upon a noise level, that assigns a parameter as the point in time of the start, the point in time of the end, the amplitude, the point in time of the amplitude, the pulse width, the lower cutoff frequency of the pulse and the upper cutoff frequency of the pulse that is identified in each case, that forms event pairs from the events that were identified and parameterized, that classifies the event pairs according to the differential time, the amplitude, the polarity, the amplitude attenuation, the pulse width, the pulse-width dispersion, the cutoff frequency or a combination of them and the cable attenuation as a characteristic in each case, that assigns at least one partial discharge from the classification and that determines the location of the partial discharge(s) from the difference in transit times between the respective partial discharge and its accompanying reflection.

A trigger is advantageously used with its characteristic trigger process to obtain data from the sensor signals. The trigger initiates data acquisition with a data quantity that is as small as possible. Since the trigger and the trigger process themselves do not have any information as to whether the trigger signal in the form of a pulse was initiated by a partial discharge, its reflection or interference, certain features are used to detect the partial discharges and their reflections.

The difference in transit times between the partial discharge and its accompanying reflection is required for the determination of the location. This difference in transit times can be obtained from the points in time of the arrival of pulses from the partial discharge and the reflection. Furthermore, a relationship exists between the pulse that is received from the partial discharge and from the accompanying reflection that is received. They are based on the cable attenuation and the pulse-width dispersion between the partial discharge and the reflection, for instance. This relationship of multiple data sets is likewise included. Since it cannot be ensured that two successive pulses in terms of time, and therefore data sets identified via the sensor unit, include a partial discharge and the reflection in the subsequent data set, the characteristics of the data sets are combined with one another to form a characteristic-set pair. After that, the relationship of the pairs of characteristics or the characteristic-set pairs with respect to one another is analyzed. These analyses lead to a further reduction in the amount of data so, as a result, characteristic-set pairs exist after these analyses that correspond to a high degree of probability to a partial-discharge event comprised of pulses of the partial discharge with the accompanying reflection.

The probability of occurrence that is automatically determined is likewise a measure of the criticality of the physical damage processes in the cable.

Partial discharges in cables can therefore be advantageously identified in a quick and direct manner at the measurement location at the end of the cable with the method and device. The method and the device are therefore particularly suitable for power cables as the cables.

Advantageous design forms of the invention are specified in claims 2 to 12.

Moreover, according to the further design form of claim 2, characteristics regarding the frequency of event pairs at a location or in a location segment are statistically evaluated to classify a partial discharge in the data-processing system; the frequency of the event pairs is a measure of the probability that a partial discharge has occurred.

The result of the locating process can be improved with that. The remaining characteristic-set pairs are subjected to a statistical analysis. Partial-discharge events can arise in the same location or with the same difference in transit times between the partial discharge and the reflection.

Inaccuracies in the measurements can be taken into consideration via the statistical analysis of confidence intervals of the measurement parameters. The measured location or the difference in transit times has a very large variation in the case of pairs of characteristics that are not based on a partial discharge. If, as an example, pairs of characteristics exist that belong to a partial discharge and to interference in equal shares, a decision can be made with statistical analysis via the frequency of the pairs of characteristics at a location or a location segment as to whether an event comprising a partial discharge or interference is involved with a very high level of probability.

In so doing, this decision cannot rigidly come down to right or wrong; further intermediate stages can be introduced in dependence upon the frequency of the pairs of characteristics in the location segment. The higher the frequency of the pairs of characteristics, the greater the probability that they actually involve events arising from partial discharges.

The result of the locating process is displayed via a mapping according to the further design form of claim 3; a scatter diagram with points of the locating result is shown in the mapping on a display device connected to the data-processing system in dependence upon the location, the amplitude and the frequency of the event pairs at a location or in a location segment. As an example, the dimension can be a three-dimensional mapping with the dimensions of amplitude, location and frequency.

Further, a color is assigned to the points in accordance with their frequency according to the further design form of claim 4. The attention of the end user is directed with the color marking to the events that correspond with a very high probability to the actual events from the partial discharges.

According to the further design form of claim 5, the identification of the events depends upon the threshold of the trigger, which is adapted to the interference power; the threshold value is determined in dependence upon the interference power via a sensitivity parameter, and the interference power can be estimated via the data from the sensor signals with an assumption of noise that is zero mean and that has a Gaussian distribution.

During the parameterization, the beginning and end of the pulse of the identified event are determined via the detection of the zero crossings before and after the point in time of the pulse according to the further design form of claim 6; possible amplitude variations with the same beginning and end are eliminated.

According to the further design form of claim 7 the difference in time for the classification is the time period of an interval determined by the pulse from the partial discharge and the pulse from the reflection; an upper limit is defined by the cable length and the cable speed.

The amplitude of the pulse, according to the further design form of claim 8, is limited for the classification by the noise and by the decoupling unit.

The reflection of the pulse of the partial discharge takes place at the open end of the cable according to the further design form of claim 9, so the reflection factor is positive and the pulse of the reflection has the same polarity.

The amplitude attenuation of the pulses of the partial discharge and the reflection is in an interval dependent upon the differential time according to the further design form of claim 10.

The pulse-width dispersion results from the dependence of the pulse width of the reflection on the pulse width of the partial discharge and from the cable properties according to the further design form of claim 11.

According to the further design form of claim 12, characteristics of the classified event pairs are also compared in the data-processing system with reference event pairs stored in memory and/or characteristics of at least one existing event from the classified event pairs is compared with reference characteristics contained in a memory unit of the data-processing system to allocate a partial discharge.

BRIEF DESCRIPTION OF THE DRAWINGS

An example of the invention is shown in the drawings in the form of its basic structure in each case, and it will be described in more detail below.

The following are shown in the figures.

DETAILED DESCRIPTION OF THE PREFERRED EMBODIMENTS

Figure 1:
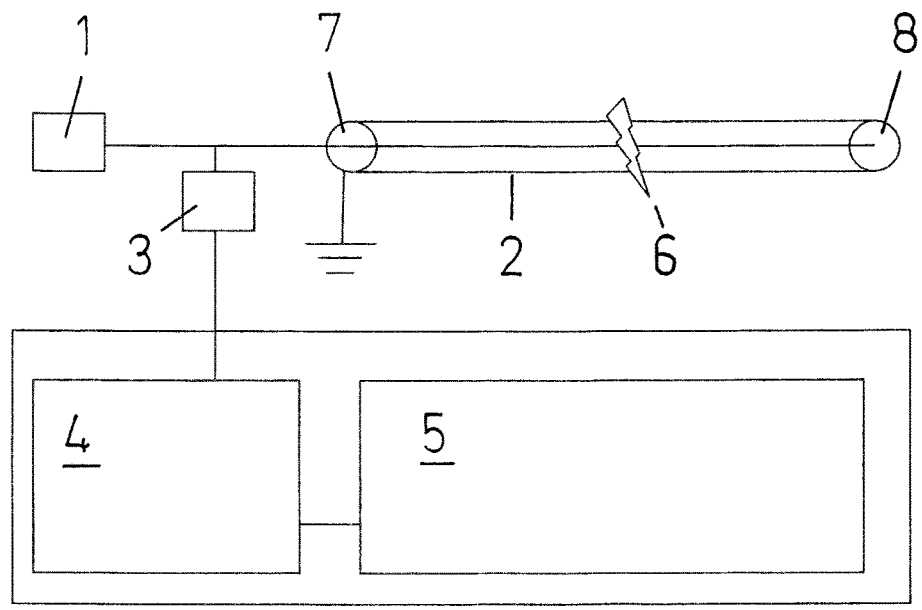
FIG. 1 shows a device for locating partial discharges in electric cables.

A method and a device for locating partial discharges in electric cables will be explained together in more detail in the following example.

A device for locating partial discharges 6 in electric cables 2 is essentially comprised of a high-voltage source 1, a decoupling unit 3, a sensor unit 4 and a data-processing system 5.

FIG. 1 shows a device for locating partial discharges 6 in electric cables 2 in a basic diagram.

The high-voltage source 1 is coupled to the cable to be tested 2. This is used to apply a high voltage of up to a few 100 kilovolts to the cable 2 to be tested. The voltage for this can be in the form of a DC voltage, a low-frequency sinusoidal voltage, a damped oscillation or a cosine square-wave voltage. Furthermore, the 50/60 Hz mains voltage of an electric power utility can be used.

Figure 2:
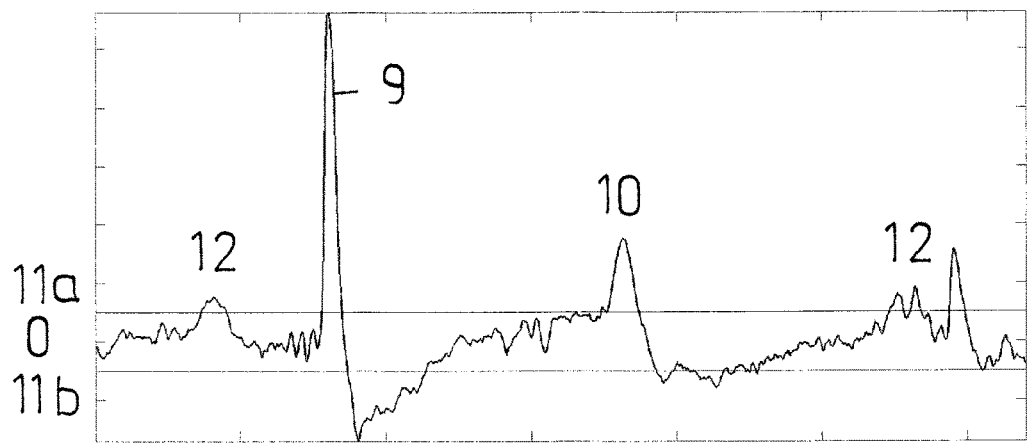
FIG. 2 shows sensor signals that can be assigned to events at the output of the decoupling unit of the device.

FIG. 2 shows sensor signals that can be assigned to events at the output of the decoupling unit 3 of the device in a basic diagram.

The high voltage leads to inhomogeneous electric fields at weak points of the insulation medium of the cable 2 to be tested. If the electric field strengths in the insulation medium exceed a critical value, an imperfect electrical discharge 6 comes about, which is also known as a partial discharge 6. The partial discharge 6 propagates in both directions of the cable 2; the decoupling unit 3 for partial discharges 6 is connected to one end of the cable 7. It is also connected via the sensor unit 4 to the data-processing system 5 as the evaluation unit. The other end of the cable 8 is open for the locating process, so the portion of the partial discharge 6 that runs in the direction of the open end of the cable 8 is reflected at that end 8. The pulse 9 of the partial discharge 6 is reflected at the open end of the cable 8 in such a way that the reflection factor is positive and the pulse 10 of the reflection has the same polarity.

The reflected signal 10 is likewise received by the decoupling unit 3 at the other end 7 of the cable 2 and supplied to the data-processing system 5 via the sensor unit 4.

The sensor unit 4 is comprised of a sensor for detecting the partial-discharge currents and amplifiers, as well as filtering arrangements. The sensor unit 4 itself delivers a digital signal, or the signal is converted into a digital signal via a known analog-digital converter.

When events exist, they are identified in the data-processing system 5 with a trigger with threshold values 11a, 11b from the sensor signals that are dependent upon the noise level. The respective threshold value 11a, 11b is adjustable for this; the threshold values 11a, 11b are determined in dependence upon the interference power via a sensitivity parameter, and the interference power can be estimated via the data from the sensor signals with an assumption of noise that is zero mean and that has a Gaussian distribution.

The events identified as pulses 9, 10, 12 are parameterized; the parameters are the point in time of the beginning of the pulse 9, 10, 12; the point in time of the end of the pulse 9, 10, 12; the amplitude of the pulse 9, 10, 12; the point in time of the amplitude of the pulse 9, 10, 12; the pulse width; the lower cutoff frequency of the pulse 9, 10, 12; and the upper cutoff frequency of the pulse 9, 10, 12.

During the parameterization, the beginning and end of the pulse 9, 10, 12 of the identified event are determined via the detection of the zero crossings before and after the point in time of the pulse 9, 10, 12. A pulse is defined in that it is concluded in terms of time by its zero crossings. Multiple triggering brought about by amplitude variations contained in the measurement signal that can be traced back to the same zero crossings in terms of time are only evaluated as being one event (pulse).

After that, pairs are formed of the events that have been parameterized and identified as pulses 9, 10, 12, which are subsequently classified. The pulses 9, 10, 12 representing event pairs are classified according to the differential time, the amplitude, the polarity, the amplitude attenuation, the pulse width, the pulse-width dispersion, the cutoff frequency or a combination of them and the cable attenuation as a characteristic in each case. The differential time for the classification is the time period of an interval determined by the pulse 9 from the partial discharge 6 and the pulse 10 from the reflection; an upper limit is defined by the cable length and the cable speed.

The amplitude attenuation of the pulses 9, 10 of the partial discharge 6 and the reflection are in an interval dependent upon the differential time here. The pulse-width dispersion from the dependency of the pulse width of the reflection results from the pulse width of the partial discharge 6 and from the cable properties.

The location of the partial discharge(s) 6 is determined from the difference in transit times between the respective partial discharge 6 and its accompanying reflection via an assignment of a partial discharge 6 from the classification; interference pulses 12 are ruled out.

Figure 3:
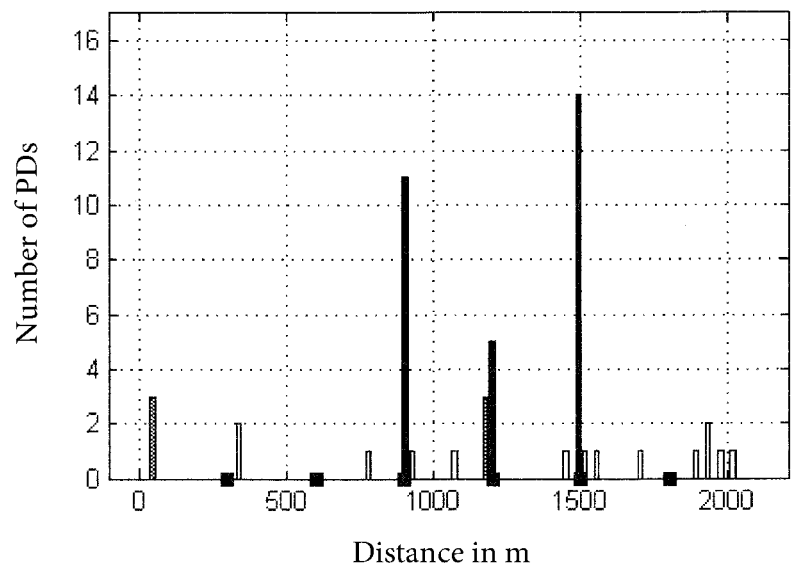
FIG. 3 shows a histogram of a locating process for partial discharges and FIG. 4 shows a mapping of this locating process.

FIG. 3 shows a histogram of a locating process for partial discharges 6 in a basic diagram.

Moreover, characteristics regarding the frequency of event pairs at a location or in a location segment are statistically evaluated to classify a partial discharge 6 in the data-processing system 5; the frequency of the event pairs is a measure of the probability that a partial discharge 6 has occurred.

Figure 4:
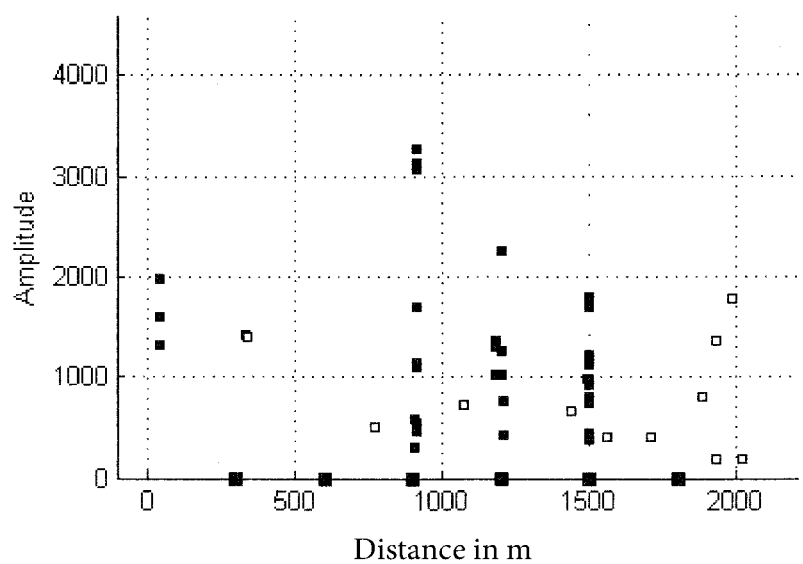

FIG. 4 shows a mapping of this locating process in a basic diagram.

The result of the locating process can be displayed via a mapping; a scatter diagram with points of the locating result is shown in the mapping on a display device connected to the data-processing system 5 in dependence upon the location, the amplitude and the frequency of the event pairs at a location or in a location segment. A color can be assigned to the points in accordance with their frequency.

In one embodiment, characteristics of the classified event pairs can also be compared in the data-processing system 5 with reference event pairs stored in memory and/or characteristics of at least one existing event from the classified event pairs can be compared with reference characteristics contained in a memory unit of the data-processing system 5 to allocate a partial discharge 6.

LIST OF REFERENCE NUMERALS

1 High-voltage source
2 Cable
3 Decoupling unit
4 Sensor unit
5 Data-processing system
6 Partial discharge
7 End of the cable
8 End of the cable
9 Pulse from partial discharge
10 Pulse from reflection
11 Threshold value
12 Interference pulse

The invention claimed is:

1. Method for locating partial discharges (6) in electric cables (2) with a high-voltage source (1) coupled to the cable (2) to be tested, a decoupling unit (3) connected to an end (7) of the cable (2) and a data-processing system (5) that is connected via a sensor unit (4) to the decoupling unit (3) and that detects a partial discharge (6) or partial discharges (6) when they exist from the sensor signals, with the following steps:
   detection of events when they are present with a trigger with a threshold value (11a, 11b) from the sensor signals dependent upon a noise level,
   parameterization of the events identified as pulses 9, 10, 12, wherein the parameters are the point in time of the beginning of the pulse (9, 10, 12), the point in time of the end of the pulse (9, 10, 12), the amplitude of the pulse (9, 10, 12), the point in time of the amplitude of the pulse (9, 10, 12), the pulse width, the lower cutoff frequency of the pulse (9, 10, 12), and the upper cutoff frequency of the pulse (9, 10, 12),
   pair formation of the events that are identified as pulses (9, 10, 12) and parameterized,
   classification of the event pairs, wherein the pulses (9, 10, 12) representing the event pairs are classified according to the differential time, the amplitude, the polarity, the amplitude attenuation, the pulse width, the pulse-width dispersion, the cutoff frequency or a combination of them and the cable attenuation as a characteristic in each case,
   assignment of a partial discharge (6) from the classification and
   determination of the location of the partial discharge(s) (6) from the difference in transit times between the respective partial discharge (6) and its accompanying reflection.

2. Method according to claim 1, characterized in that characteristics regarding the frequency of event pairs at a location or in a location segment are also statistically evaluated to classify a partial discharge (6) in the data-processing system (5), wherein the frequency of the event pairs is a measure of the probability that a partial discharge (6) has occurred.

3. Method according to claim 1, characterized in that the result of the locating process is displayed via a mapping, wherein a scatter diagram with points of the locating result is shown in the mapping on a display device connected to the data-processing system (5) in dependence upon the location, the amplitude and the frequency of the event pairs at a location or in a location segment.

4. Method according to claim 3, characterized in that a color is assigned to the points in accordance with their frequency.

5. Method according to claim 1, characterized in that the identification of the events depends upon the threshold (11a, 11b) of the trigger that has been adapted to the interference power, wherein the threshold value (11a, 11b) is determined in dependence upon the interference power via a sensitivity parameter and the interference power can be estimated via the data from the sensor signals with an assumption of noise that is zero mean and that has a Gaussian distribution.

6. Method according to claim 1, characterized in that the beginning and end of the pulse (9, 10, 12) of the identified event are determined during the parameterization via the detection of the zero crossings before and after the point in time of the pulse (9, 10, 12), wherein possible amplitude variations with the same beginning and end are eliminated.

7. Method according to claim 1, characterized in that the differential time for the classification is the time period of an interval determined by the pulse (9) from the partial discharge (6) and the pulse (10) from the reflection, wherein an upper limit is defined by the cable length and the cable speed.

8. Method according to claim 1, characterized in that the amplitude of the pulse (9, 10, 12) is limited for the classification by the noise and by the decoupling unit.

9. Method according to claim 1, characterized in that the pulse (9) of the partial discharge (6) are reflected at the open end of the cable (8) in such a way that the reflection factor is positive and the pulse (10) of the reflection has the same polarity.

10. Method according to claim 1, characterized in that the amplitude attenuation of the pulse (9) of the partial discharge (6) and the pulse (10) of the reflection is in an interval dependent upon the differential time.

11. Method according to claim 1, characterized in that the pulse-width dispersion results from the dependence of the pulse width of the reflection on the pulse width of the partial discharge (6) and from the cable properties.

12. Method according to claim 1, characterized in that characteristics of the classified event pairs are also compared with reference event pairs stored in memory and/or characteristics of at least one existing event from the classified event pairs are compared with reference characteristics contained in a memory unit of the data-processing system (5) to allocate a partial discharge (6) in the data-processing system (5).

13. Device for locating partial discharges (6) in electric cables (2) with the method according to claim 1 with a high-voltage source (1) coupled to the cable (2) to be tested, a decoupling unit (3) connected to an end (7) of the cable (2) and a data-processing system (5) that is connected via a sensor unit (4) to the decoupling unit (3) and that ascertains the situation from sensor signals when a partial discharge (6) or partial discharges (6) exist, wherein the data-processing system (5) is a data-processing system (5) that identifies existing events as an impulse (9, 10, 12) with a trigger with a threshold value (11a, 11b) from sensor signals dependent upon a noise level, that assigns a parameter as the point in time of the start, the point in time of the end, the amplitude, the point in time of the amplitude, the pulse width, the lower cutoff frequency of the pulse (9, 10, 12) and the upper cutoff frequency of the pulse (9, 10, 12) that is identified in each case, that forms event pairs from the events that were identified and parameterized, that classifies the event pairs according to the differential time, the amplitude, the polarity, the amplitude attenuation, the pulse width, the pulse-width dispersion, the cutoff frequency or a combination of them and the cable attenuation as a characteristic in each case, that assigns at least one partial discharge (6) from the classification and that determines the location of the partial discharge(s) (6) from the difference in transit times between the respective partial discharge (6) and its accompanying reflection.

* * * * *